United States Patent
Chung-Chieh et al.

(10) Patent No.: US 9,519,015 B2
(45) Date of Patent: Dec. 13, 2016

(54) RISE TIME AND FALL TIME MEASUREMENT

(71) Applicant: Taiwan Semiconductor Manufacturing Co. Limited, Hsin-Chu (TW)

(72) Inventors: Yang Chung-Chieh, Zhubei (TW); Chih-Chiang Chang, Taipei (TW); Chung-Ting Lu, Kaohsiung (TW); Chung-Peng Hsieh, New Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 347 days.

(21) Appl. No.: 14/167,024

(22) Filed: Jan. 29, 2014

(65) Prior Publication Data

US 2015/0212128 A1    Jul. 30, 2015

(51) Int. Cl.
- *G01R 27/28* (2006.01)
- *G01R 19/12* (2006.01)
- *G01R 29/02* (2006.01)
- *G01R 31/00* (2006.01)

(52) U.S. Cl.
CPC .............. *G01R 27/28* (2013.01); *G01R 19/12* (2013.01); *G01R 29/02* (2013.01); *G01R 31/00* (2013.01)

(58) Field of Classification Search
CPC .................. G01R 31/31725; G01R 31/31922; G01R 31/2882; G01R 31/11; G01R 31/31937; G01R 27/28; G01R 31/00

USPC .................. 324/76.11–76.83, 459, 600, 615, 617,324/635

See application file for complete search history.

(56) References Cited

U.S. PATENT DOCUMENTS

| | | | |
|---|---|---|---|
| 6,349,267 B1 | 2/2002 | Goldthorp et al. | |
| 7,681,091 B2 * | 3/2010 | Hafed | G01R 31/2882 324/76.58 |
| 8,564,471 B1 * | 10/2013 | Gao | G04F 10/005 341/155 |
| 2003/0058970 A1 * | 3/2003 | Hamre | G01J 11/00 375/342 |
| 2008/0231310 A1 * | 9/2008 | Vijayaraghavan | G01R 31/31715 324/750.3 |
| 2013/0049810 A1 | 2/2013 | Lu et al. | |
| 2014/0152346 A1 * | 6/2014 | Nakajima | H03K 5/2481 327/87 |

* cited by examiner

*Primary Examiner* — Son Le
*Assistant Examiner* — Raul Rios Russo
(74) *Attorney, Agent, or Firm* — Cooper Legal Group, LLC

(57) ABSTRACT

Among other things, one or more systems and techniques for transition time evaluation of a circuit are provided herein. In some embodiments, a comparator is configured to receive a circuit signal from the circuit. The circuit signal is evaluated by the comparator based upon one or more control voltages to create one or more voltage waveforms. In some embodiments, the one or more voltage waveforms have substantially similar slopes. A time converter, such as a time-to-current converter or a time-to-digital converter, is used to evaluate the one or more output waveforms to determine a transition time, such as a rise time or a fall time, of the circuit. In some embodiments, the one or more output waveforms are used to reconstruct a transition waveform representing a waveform of the circuit signal.

20 Claims, 6 Drawing Sheets

$$V_{TRIP2} - V_{TRIP1} = V_{CTRL2} - V_{CTRL1}$$

$$\text{FALL TIME}_{10\%-90\%} = \Delta t \times \frac{(90\% - 10\%)V_{DD}}{V_{CTRL2} - V_{CTRL1}}$$

RISE TIME AND FALL TIME MEASUREMENT

BACKGROUND

Many devices comprise circuitry that performs various functionality. In an example, digital logic circuitry operates using two voltage levels, such as a first voltage representing a logic "0" and a second voltage representing a logic "1." The digital logic circuitry switches between the logic "1" state, and the logic "0" state depending upon operations performed by the digital logic circuitry or data stored by the digital logic circuitry.

DETAILED DESCRIPTION

Figure 1:
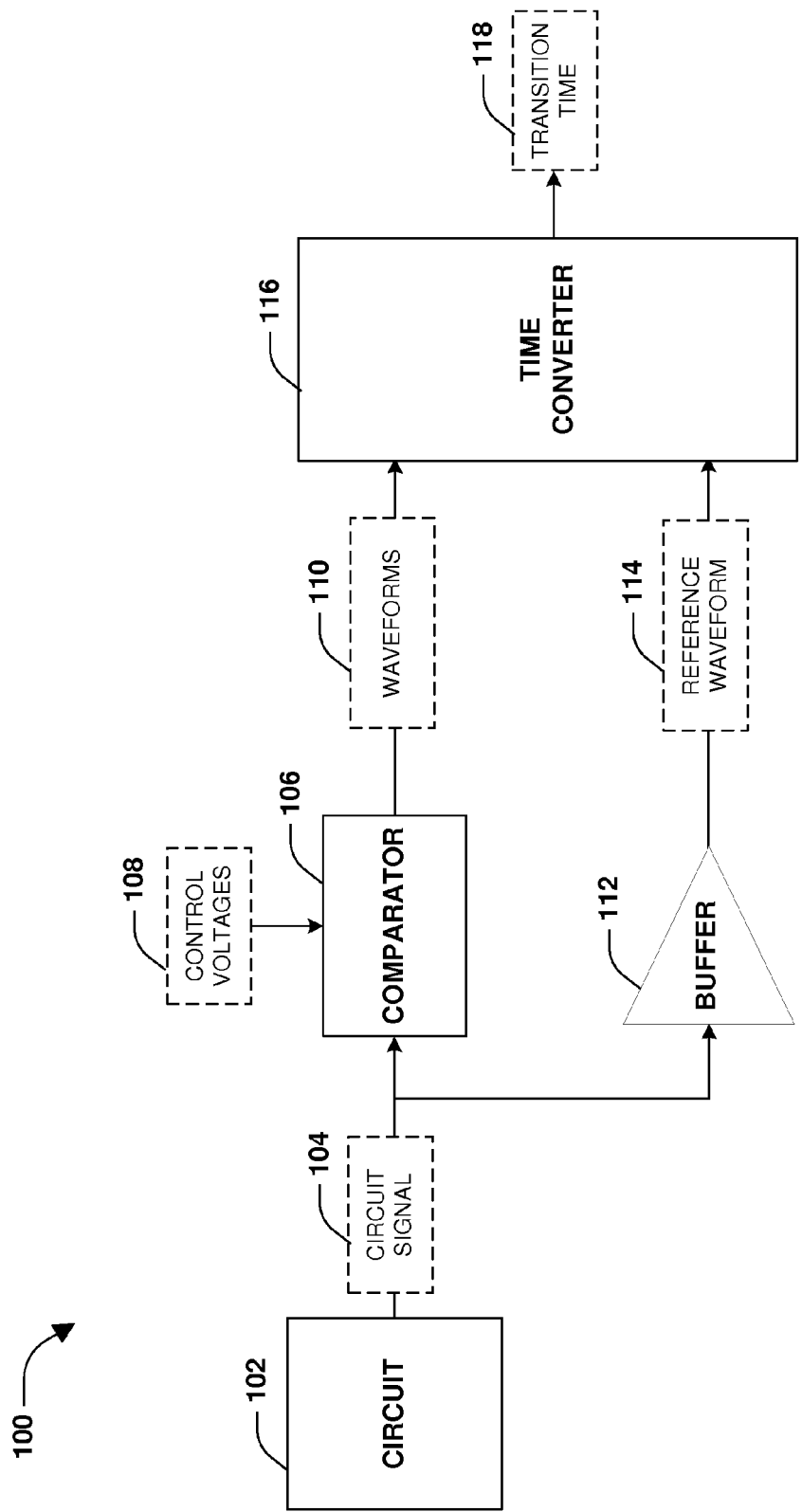
FIG. 1 is an illustration of a timing measurement system for determining a transition time of a circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Because circuitry, such as digital logic circuitry, does not switch between logic "0" and logic "1" instantaneously, there is an inherent delay corresponding to a rise time and a fall time. The rise time is a time for the digital logic circuitry to switch from the logic "0" low state to the logic "1" high state. The fall time is a time for the digital logic circuitry to switch from the logic "1" high state to the logic "0" low state. This is way, circuitry, such as digital logic circuitry, analog circuitry, and mixed-signal circuitry, have rise times and fall times that affect speed of the circuitry. Accordingly, as provided herein transition times, such as at least one of rise times or fall times, of circuitry are evaluated so that delay of the circuitry can be taken into account.

One or more techniques and systems for transition time evaluation of a circuit are provided. In some embodiments, a timing measurement system is configured to evaluate a circuit signal from a circuit utilizing one or more control voltages to create output waveforms. The output waveforms are evaluated to determine a transition time, such as at least one of a rise time or a fall time, of the circuit. The timing measurement system is a plug and play architecture that can be integrated into an integrated circuit within which the circuit is embedded. The timing measurement system is used to measure rise times and fall times of target nodes without having to control input to the circuit and without having to utilize a clock. In some embodiments, a comparator is configured to create one or more output waveforms for transition time evaluation of a circuit, such as at least one of a digital circuit, an analog circuit, or a mixed-signal circuit. In some embodiments of the comparator, the comparator comprises a transistor, such as a PMOS transistor. The transistor comprises a gate that is connected to the circuit, which provides a relatively low load effect to the circuit. The comparator can operate without calibration such as without extraction of Vtrip values, which mitigates testing costs for the circuit. In some embodiments, a transition waveform is reconstructed, such as by utilizing the comparator. The transition waveform is a reconstruction of a waveform for the circuit output from the circuit. A plurality of sample voltage levels are used to reconstruct the transition waveform to improve measuring accuracy of rise times and fall times of the circuit.

FIG. 1 illustrates a timing measurement system 100 for determining a transition time 118 of a circuit 102. The circuit 102 is evaluated as a device under test (DUT) such that at least one of a rise time or a fall time associated with the circuit 102 is measured as the transition time 118. The circuit 102 comprises at least one of a digital circuit, an analog circuit, or a mix-signal circuit. In some embodiments, the circuit 102 is comprised within an integrated circuit within which the timing measurement system 100 is embedded. In some embodiments, the timing measurement system 100 provides system on-chip timing characterization data associated with the integrated circuit. The timing measurement system 100 comprises at least one of a comparator 106, a time converter 116, or a buffer 112. In some embodiments, the timing measurement system 100 does not comprise the buffer 112. In some embodiments, the buffer 112 is integrated into the time converter 116. In some embodiments, the time converter 116 comprises a time-to-current converter configured to create a current output used to determine the transition time 118, such as a delay between two nodes. In some embodiments, the time converter 116 comprises a time-to-digital converter configured to create a digital code output used to determine the transition time 118.

The comparator 106 is configured to receive a circuit signal 104 from the circuit 102. In some embodiments, the circuit 102 operates based upon an input provided by a source that is external to the timing measurement system 100. In some embodiments, the timing measurement system 100 does not provide the input to the circuit 102 and does not utilize a clock. The comparator 106 is configured to evaluate the circuit signal 104 based upon one or more control voltages 108 to create output waveforms 110. In some embodiments, a first control voltage corresponds to a first trip voltage of the comparator 106. When the circuit signal 104 crosses the first trip voltage, the comparator 106 creates a first output waveform as the output waveforms 110. A second control voltage corresponds to a second trip voltage of the comparator 106. When the circuit signal crosses the second trip voltage, the comparator 106 creates a second output waveform as the output waveforms 110. In some embodiments, the comparator 106 converts the circuit signal 104, such as a slew rate, into an edge delay difference. In some embodiments, the edge delay difference is transformed by the time converter 116 into a current output or a digital code output. In some embodiments, the first output waveform has a first slope and the second output waveform has a second slope corresponding to the first slope. In some embodiments, the first slope is substantially similar to or the same as the first slope such that at least a portion of the first output waveform is "parallel" to at least a portion of the second output waveform. In some embodiments, any number of output waveforms 110 are created based upon the one or more control voltages 108.

In some embodiments, the buffer 112 is configured to receive the circuit signal 104. The buffer 112 is configured to generate a reference waveform 114 based upon the circuit signal 104. The reference waveform 114 is used as a reference point for the one or more control voltages 108, and does not have a delay that impacts transition time 118 measurement. The buffer 112 provides the reference waveform 114 to the time converter 116. The time converter 116 is configured to evaluate the output waveforms 110, such as the first output waveform and the second output waveform, to determine the transition time 118, such as at least one of a rise time or a fall time, of the circuit 102. In some embodiments, the time converter 116 utilizes the reference waveform 114 to evaluate the output waveforms 110. In some embodiments, the timing measurement system 100 provides at least one of digital rise/fall time measurement, analog OPAMP output slew rate measurement, high-speed low-swing current mode logic (CML) slew time measurement, etc.

In some embodiments, the transition time 118 corresponds to a simulation rise time. In some embodiments, a difference between the simulation rise time and a target rise time is between about 0.01 ps and about 2 ps, such as at least one of about a 0.41 ps difference for a target rise time of about 36.32 ps, about a 1.62 ps difference for a target rise time of about 46.35 ps, about a 1.22 ps difference for a target rise time of about 63.36 ps, or about a 0.67 ps difference for a target rise time of about 97.84, etc.

In some embodiments, the transition time 118 corresponds to a simulation fall time. In some embodiments, a difference between the simulation fall time and a target fall time is between about −2 ps to about −4.5 ps, such as at least one of about a −2.87 ps difference for a target fall time of about 41.01 ps, about a −3.47 ps difference for a target fall time of about 52.14 ps, about a −2.71 ps difference for a target fall time of about 70.80 ps, or about a −3.63 ps difference for a target fall time of about 108.46 ps, etc.

In some embodiments, the time converter 116 comprises a time-to-current inverter. The time-to-current inverter at least one of provides relatively high accuracy, is free of calibration, or provides timing test by a DC meter. In some embodiments, the time-to-current inverter provides a two-step measurement that provides about 1 ps resolution and accuracy. During the first step, the time-to-current inverter is configured to test a DC current. During the second step, the time-to-current inverter is configured to test an average current. The time-to-current inverter determines the transition time 118 based upon $$Td = \frac{Iavg \times Tck}{Idc},$$

where Td is a time that a VDC voltage is high, Idc is a current while the VDC voltage is high, Tck is a clock period, and Iavg is the average current measured by the time-to-current inverter during the second step. In this way, the time-to-current inverter determines a current that is used to measure rise and fall times.

In some embodiments, the time converter 116 comprises a time-to-digital converter. The time-to-digital convert comprises one or more delay cells, such as a Vernier delay cell, that is used for relatively fine grained delay. The time-to-digital converter comprises a coarse delay circuit used for delay measurement range enhancement. The time-to-digital converter comprises one or more comparators that are calibrated as zero offset comparators. In some embodiments, a first signal is processed by the coarse delay circuit, resulting in a first coarse signal. In some embodiments, a second signal is processed by the coarse delay circuit, resulting in a second coarse signal. In some embodiments, the first coarse signal is processed by a first set of delay cells and the second coarse signal is processed by a second set of delay cells. In some embodiments, a first pair of delay cells comprises a first delay cell within the first set of delay cells and a second delay cell within the second set of delay cells. In some embodiments, the first delay cell processes the first coarse signal to create a first result. In some embodiments, the second delay cell processes the second coarse signal to create a second result. In some embodiments, the first result and the second result are compared by a first comparator. In some embodiments, the first comparator determines that a difference between the first result and the second result is about 2 ps to about 3 ps. In this way, the first signal and the second signal are processed and compared to determine a digital output indicating of the transition time 118.

Figure 2:
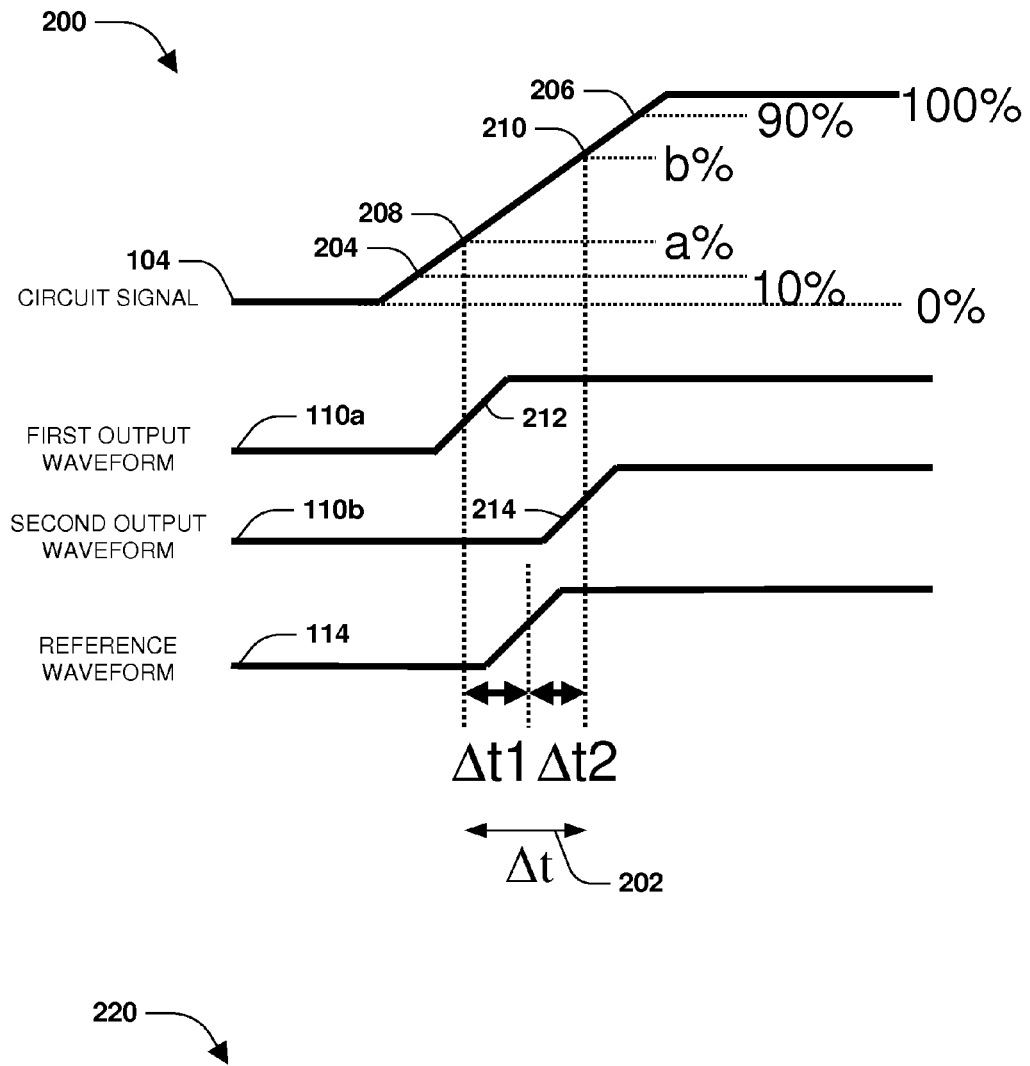
FIG. 2 is an illustration of a waveform graph and a rise time equation, in accordance with some embodiments.

FIG. 2 illustrates a waveform graph 200 and a rise time equation 220. The waveform graph 200 comprises the circuit signal 104 output by the circuit 102, such as a transition from a low state to a high state. A first trip point 208 is represented by a % and a second trip point 210 is represented by b % within the waveform graph 200. In some embodiments, the first trip point 208 and the second trip point 210 are unknown, and are thus free of calibration. In some embodiments, a difference between the second control voltage ($V_{CTRL2}$) and the first control voltage ($V_{CTRL1}$) in relation to a $V_{DD}$, such as a supply voltage, for the circuit 102 corresponds to a difference between the second trip point (b %) and the first trip point (a %) where $$\frac{V_{CTRL2} - V_{CTRL1}}{V_{DD}} = \frac{b\% - a\%}{100\%}.$$

The comparator 106 is configured to generate a first output waveform 110a based upon the first control voltage. The comparator 106 is configured to generate the second output waveform 110b based upon the second control voltage. The first output waveform 110a has a first slope 212 that corresponds to a second slope 214 of the second output waveform 214. In some embodiments, the first slope 212 is substantially similar to or the same as the second slope 214. In some embodiments, a rise time is measured between a 10% node 204 and a 90% node 206 of the circuit signal 104 and the time converter 116 is configured to measure a change in time Δt 202 between the first trip point 208 and the second trip 210, thus resulting in $$\frac{\text{Rise } Time_{10\%-90\%}}{\Delta t} = \frac{90\% - 10\%}{b\% - a\%}.$$

The time converter 116 is configured to evaluate the first output waveform 110a and the second output waveform 110b in light of the reference waveform 114 to determine the transition time 118. In some embodiments, the rise time equation 220:

$$\text{Rise } Time_{10\%-90\%} = \Delta t \times \frac{(90\% - 10\%)V_{DD}}{V_{CTRL2} - V_{CTRL1}}$$

is used to determine the rise time.

Figure 3:
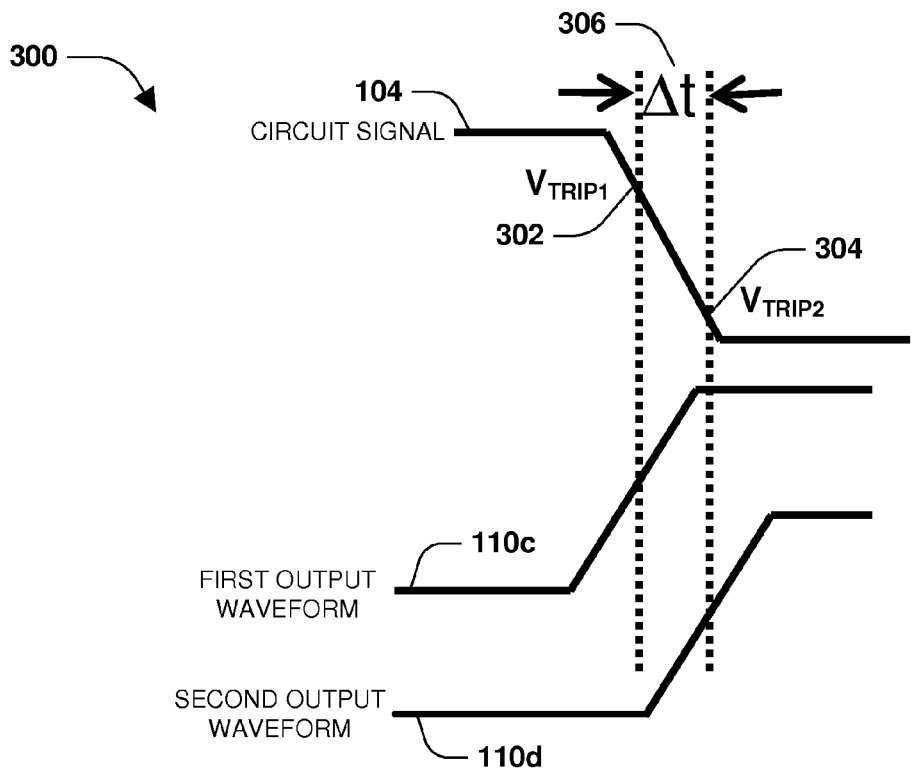
FIG. 3 is an illustration of a waveform graph, a voltage trip equation, and a fall time equation, in accordance with some embodiments.

FIG. 3 illustrates a waveform graph 300, a voltage trip equation 310, and a fall time equation 320. The graph waveform 300 comprises the circuit signal 104 output by the circuit 102, such as a transition from a high state to a low state. A first control voltage is used to evaluate the circuit signal 104 to create a first output waveform 110c. A second control voltage is used to evaluate the circuit signal 104 to create a second output waveform 110d. The first control voltage and the second control voltage correspond to a first trip point 302 and a second trip point 304 used to trigger the comparator 106 to create the first output waveform 110c and the second output waveform 110d. A difference between the second trip point 304 and the first trip point 302 corresponds to a difference between the second control voltage and the first control voltage, resulting in the voltage trip equation 310: $V_{TRIP2} - V_{TRIP1} = V_{CTRL2} - V_{CTRL1}$. In some embodiments, a fall time equation 320:

$$\text{Fall } Time_{10\%-90\%} = \Delta t \times \frac{(90\% - 10\%)V_{DD}}{V_{CTRL2} - V_{CTRL1}}$$

is used to determine the fall time.

Figure 4:
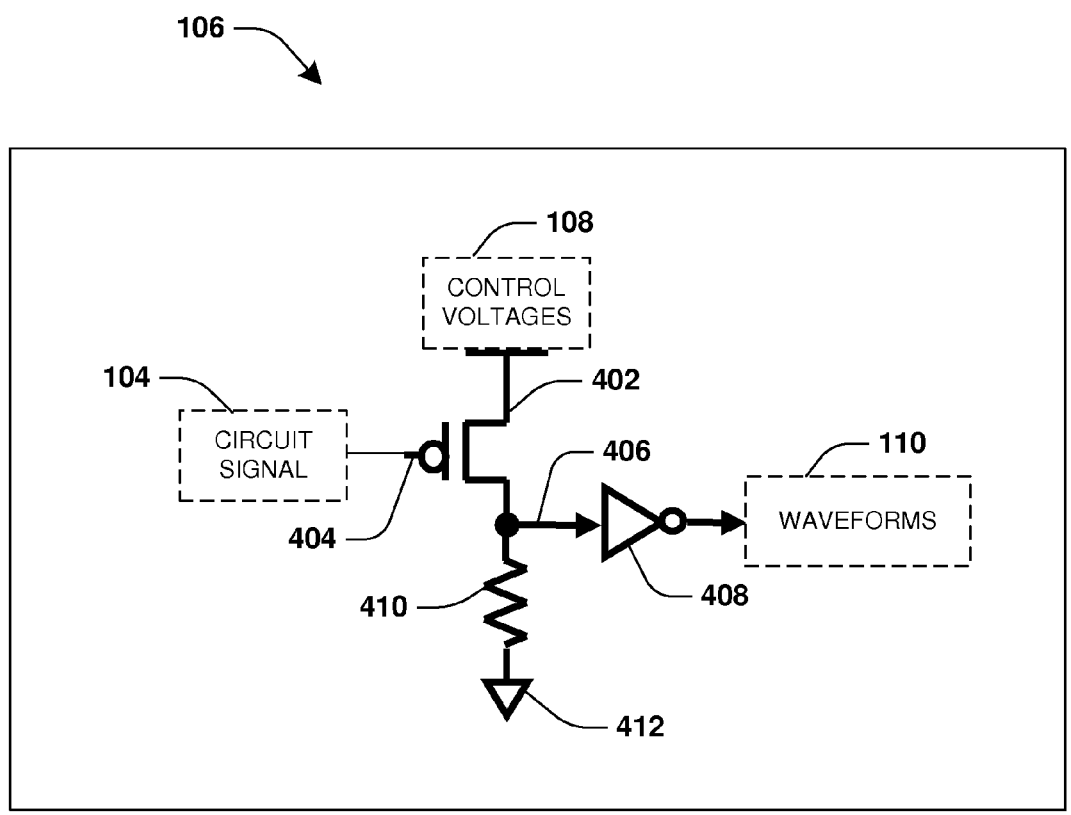
FIG. 4 is an illustration of a comparator, in accordance with some embodiments.

FIG. 4 illustrates the comparator 106. In some embodiments, the comparator 106 comprises a transistor, such as a PMOS transistor. The comparator 106 comprises a first input node 404, such a gate of the transistor. The first input node 404 is configured to receive the circuit signal 104 from the circuit 102. The comparator 106 comprises a second input node 402, such as a source of the transistor. The second input node 402 is configured to receive one or more control voltages 108 for evaluation of the circuit signal 104. The comparator 106 comprises an output node 406, such as a drain of the transistor. In some embodiments, the output node 406 is connected to ground 412 or some other suitable voltage level through a resistor 410. In some embodiments, the output node 406 is connected to an inverter 408 configured to invert an output from the output node 406. The output node 406 is configured to output the output waveforms 110 for transition time evaluation of the circuit 102.

The output waveforms 110 are generated based upon an evaluation of the circuit signal 104 relative to the one or more control voltages 108.

Figure 5:
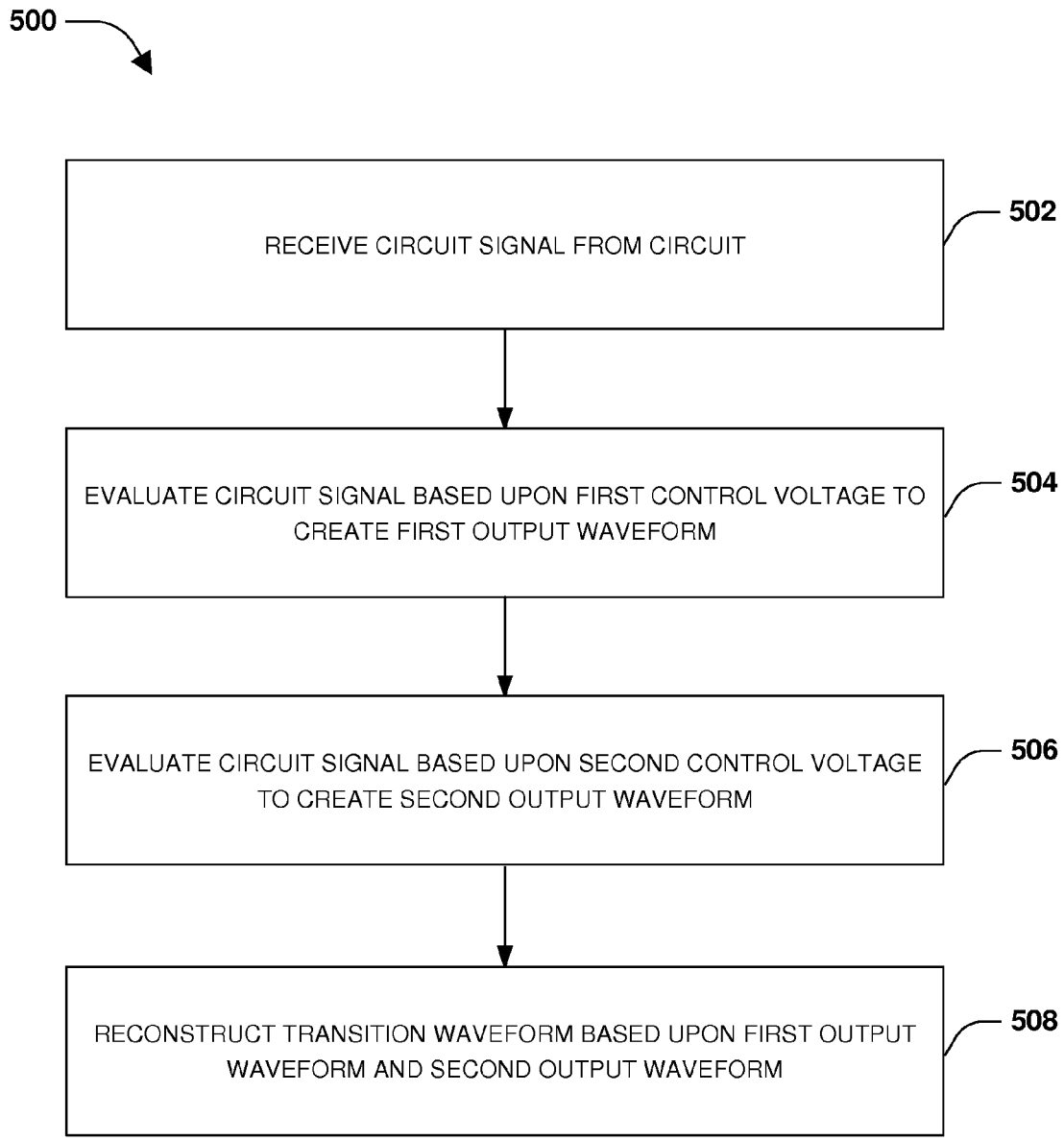
FIG. 5 is a flow diagram illustrating a method of reconstructing a transition waveform, in accordance with some embodiments.

A method 500 of reconstructing a transition waveform is illustrated in FIG. 5. At 502, a circuit signal is received from a circuit. In some embodiments, the comparator 106 receives the circuit signal 104 from the circuit 102. At 504, the circuit signal is evaluated, such as by the comparator 106, based upon a first control voltage to create a first output waveform. At 506, the circuit signal is evaluated, such as by the comparator 106, based upon a second control voltage to create a second output waveform. In some embodiments, the first output waveform has a first slope and the second output waveform has a second slope corresponding to the first slope. In some embodiments, one or more additional output waveforms are created based upon the circuit signal and one or more additional control voltages. At 508, a transition waveform, corresponding to the circuit signal, is reconstructed based upon the first output waveform and the second output waveform. In some embodiments, the transition waveform is reconstructed based upon the one or more additional output waveforms. In some embodiments, the transition waveform is a reconstruction of a waveform for the circuit signal. At least one of a rise time or a fall time for the circuit is determined based upon the transition waveform.

Figure 6:
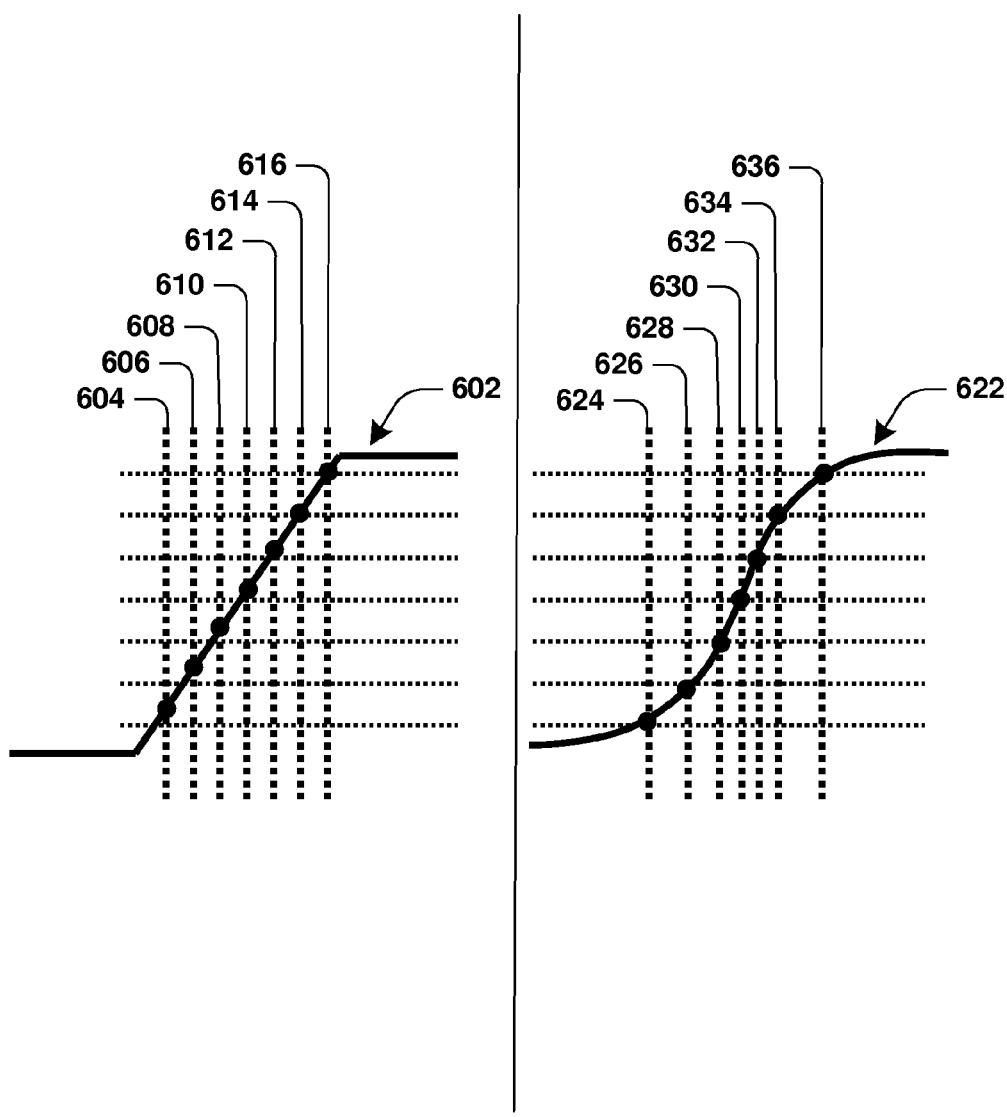
FIG. 6 is an illustration of first transition waveform reconstructed for a digital circuit and a second transition waveform reconstructed for an analog circuit, in accordance with some embodiments.

FIG. 6 illustrates a first transition waveform 602 reconstructed for a digital circuit and a second transition waveform 622 reconstructed for an analog circuit. The first transition waveform 602 is reconstructed based upon a plurality of samples of a digital circuit signal from the digital circuit. The plurality of samples are collected at a first trip point 604, a second trip point 606, a third trip point 608, a fourth trip point 610, a fifth trip point 612, a sixth trip point 614, and a seventh trip point 616. It is appreciated that any number of trip points could be used to collect samples from the digital circuit signal, and that seven trip points are merely used for illustrative purposes. The samples are used to reconstruct the first transition waveform 602 to represent the digital circuit signal of the digital circuit. The first transition waveform 602 is used to determine at least one of a rise time or a fall time for the digital circuit.

The second transition waveform 622 is reconstructed based upon a plurality of samples of an analog circuit signal from the analog circuit. The plurality of samples are collected at a first trip point 624, a second trip point 626, a third trip point 628, a fourth trip point 630, a fifth trip point 632, a sixth trip point 634, and a seventh trip point 636. It is appreciated that any number of trip points could be used to collect samples from the analog circuit signal, and that seven trip points are merely used for illustrative purposes. The samples are used to reconstruct the second transition waveform 622 to represent the analog circuit signal of the analog circuit. The second transition waveform 622 is used to determine at least one of a rise time or a fall time for the analog circuit.

Various operations of embodiments are provided herein. In some embodiments, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a timing measurement system for determining a transition time of a circuit is provided. The timing measurement system comprises a comparator. The comparator is configured to receive a circuit signal from a circuit. The comparator is configured to evaluate the circuit signal based upon a first control voltage to create a first output waveform. The comparator is configured to evaluate the circuit signal based upon a second control voltage to create a second output waveform. The timing measurement system comprises a time converter component configured to evaluate the first output waveform and the second output waveform to determine a transition time of the circuit.

According to an aspect of the instant disclosure, a comparator for creating one or more output waveforms for transition time evaluation of a circuit is provided. The comparator comprises a first input node configured to receive a circuit signal from a circuit. The comparator comprises a second input node configured to receive one or more control voltages for evaluation of the circuit signal. The comparator comprises an output node configured to output one or more output waveforms for transition time evaluation of the circuit. The one or more output waveforms are based upon an evaluation of the circuit signal relative to the one or more control voltages.

According to an aspect of the instant disclosure, a method for reconstructing a transition waveform is provided. The method comprises receiving a circuit signal from a circuit. The circuit signal is evaluated based upon a first control voltage to create a first output waveform. The circuit signal is evaluated based upon a second control voltage to create a second output waveform. A transition waveform is reconstructed based upon the first output waveform and the second output waveform.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A timing measurement system for determining a transition time of a circuit, comprising:
   a comparator configured to:
      receive a circuit signal from a circuit;
      evaluate the circuit signal based upon a first control voltage to create a first output waveform; and
      evaluate the circuit signal based upon a second control voltage to create a second output waveform; and
   a time converter component; and
   a buffer component configured to:
      receive the circuit signal from the circuit;
      generate a reference waveform based upon the circuit signal; and
      provide the reference waveform to the time converter component,
   wherein:
      the time converter component is configured to evaluate the first output waveform and the second output waveform using the reference waveform to determine a transition time of the circuit; and
      wherein an input terminal of the buffer component and an input terminal of the comparator are coupled to the circuit at a common node.

2. The timing measurement system of claim 1, the circuit comprising at least one of a digital circuit, an analog circuit, or a mixed-signal circuit.

3. The timing measurement system of claim 1, the transition time comprising a rise time.

4. The timing measurement system of claim 1, the transition time comprising a fall time.

5. The timing measurement system of claim 1, the circuit operating based upon an input provided by a source external to the timing measurement system.

6. The timing measurement system of claim 1, the circuit comprised within an integrated circuit within which the timing measurement system is embedded.

7. The timing measurement system of claim 1, the time converter component comprising at least one of a time-to-current converter or a time-to-digital converter.

8. The timing measurement system of claim 1, the first output waveform having a first slope and the second output waveform having a second slope corresponding to the first slope.

9. The timing measurement system of claim 1, the comparator comprising:
  a transistor comprising a gate, a source, and a drain, the gate operatively coupled to the common node to receive the circuit signal, the source operatively coupled to a voltage control input to receive at least one of the first control voltage or the second control voltage, and the drain operatively coupled to an inverter for outputting at least one of the first output waveform or the second output waveform to the time converter component.

10. The timing measurement system of claim 9, the comparator comprising:
  a resistor coupled between the drain of the transistor and a second voltage source, wherein the drain, the resistor, and the inverter are coupled to a second common node.

11. A time measurement system for determining a transition time of a circuit, comprising:
  a comparator comprising a transistor having:
    a gate coupled to a circuit, the circuit applying a circuit signal having a non-constant voltage to the gate;
    a first source/drain terminal coupled to a voltage source configured to apply one or more control voltages for evaluation of the circuit signal; and
    a second source/drain terminal operably coupled to a time converter component, wherein one or more output waveforms for transition time evaluation of the circuit are output from the second source/drain terminal to the time converter component, the one or more output waveforms based upon an evaluation of the circuit signal relative to the one or more control voltages; and
  a buffer having an input terminal coupled to the gate of the transistor at a common node and an output terminal coupled to the time converter component.

12. The time measurement system of claim 11, the comparator comprising a resistor coupled between the second source/drain terminal and a second voltage source.

13. The time measurement system of claim 11, the comparator comprising:
  an inverter coupled between the second source/drain terminal and the time converter component, the one or more output waveforms applied to the inverter.

14. The time measurement system of claim 11, the time converter component comprising at least one of a time-to-current converter or a time-to-digital converter.

15. The time measurement system of claim 11, the comparator comprising:
  a resistor coupled between the second source/drain terminal and a second voltage source; and
  an inverter coupled between the second source/drain terminal and the time converter component, wherein the second source/drain terminal, the resistor, and the inverter are coupled to a second common node.

16. The time measurement system of claim 11, the one or more output waveforms comprising a first output waveform and a second output waveform, the first output waveform having a first slope and the second output waveform having a second slope corresponding to the first slope.

17. A method for reconstructing a transition waveform, comprising:
  receiving, from a circuit, a circuit signal concurrently applied to a buffer and a comparator;
  evaluating, at the comparator, the circuit signal based upon a first control voltage to create a first output waveform;
  evaluating, at the comparator, the circuit signal based upon a second control voltage to create a second output waveform;
  generating, at the buffer, a reference waveform based upon the circuit signal; and
  reconstructing a transition waveform based upon the first output waveform, the second output waveform, and the reference waveform.

18. The method of claim 17, comprising creating one or more additional output waveforms based upon the circuit signal and one or more additional control voltages, and the reconstructing comprising reconstructing the transition waveform based upon the one or more additional output waveforms.

19. The method of claim 17, the first output waveform having a first slope and the second output waveform having a second slope corresponding to the first slope.

20. The method of claim 17, comprising:
  determining at least one of a rise time or a fall time for the circuit based upon the transition waveform.

* * * * *